(12) United States Patent
Sekiya et al.

(10) Patent No.: US 10,562,207 B2
(45) Date of Patent: Feb. 18, 2020

(54) WAFER PROCESSING METHOD

(71) Applicant: DISCO CORPORATION, Tokyo (JP)

(72) Inventors: Kazuma Sekiya, Tokyo (JP); Shigenori Harada, Tokyo (JP); Motoki Ishikawa, Tokyo (JP); Takaaki Inoue, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 183 days.

(21) Appl. No.: 15/892,493

(22) Filed: Feb. 9, 2018

(65) Prior Publication Data

US 2018/0229396 A1    Aug. 16, 2018

(30) Foreign Application Priority Data

Feb. 14, 2017 (JP) .................. 2017-024829

(51) Int. Cl.
| | |
|---|---|
| *B28D 5/02* | (2006.01) |
| *B28D 7/02* | (2006.01) |
| *B28D 1/04* | (2006.01) |
| *H01L 21/78* | (2006.01) |
| *B28D 5/00* | (2006.01) |
| *H01L 21/683* | (2006.01) |

(Continued)

(52) U.S. Cl.
CPC ............ *B28D 5/0076* (2013.01); *B28D 1/04* (2013.01); *B28D 5/0005* (2013.01); *B28D 5/0052* (2013.01); *B28D 7/02* (2013.01); *B28D 7/046* (2013.01); *H01L 21/02076* (2013.01); *H01L 21/67092* (2013.01); *H01L 21/6836* (2013.01); *H01L 21/78* (2013.01); *B28D 5/022* (2013.01); *H01L 2221/68327* (2013.01)

(58) Field of Classification Search
CPC .. B28D 5/0005; B28D 5/0029; B28D 5/0052; B28D 5/0076; B28D 5/0094; B28D 5/022; B28D 7/02; B28D 7/046; B28D 1/04; H01L 21/02057; H01L 21/02076; H01L 21/0209; H01L 21/683; H01L 21/6836; H01L 21/78; H01L 2221/68327
USPC ...................................... 125/13.01
See application file for complete search history.

(56) References Cited

U.S. PATENT DOCUMENTS

| | | | |
|---|---|---|---|
| 6,582,983 B1 * | 6/2003 | Runyon | H01L 21/6835 257/E23.02 |
| 6,945,521 B2 * | 9/2005 | Yoshida | B01F 3/04985 261/76 |

(Continued)

FOREIGN PATENT DOCUMENTS

JP             11300184 A      11/1999

*Primary Examiner* — Eileen P Morgan
(74) *Attorney, Agent, or Firm* — Greer Burns & Crain Ltd.

(57) ABSTRACT

A wafer processing method includes: a holding step of holding a wafer on a chuck table through a dicing tape; and a dividing step of cutting the wafer along division lines by a cutting blade. In the dividing step, cleaning water including pure water mixed with carbon dioxide is supplied to the front surface of the wafer, and cutting water including pure water alone or pure water mixed with carbon dioxide in a concentration lower than that of the cleaning water is supplied to the cutting blade. During cutting, therefore, the cleaning water and the cutting water are always shielded by each other. Consequently, the cutting blade can be prevented from being corroded or excessively worn due to the cleaning water, and the cutting water can be prevented from contacting the front surface of the wafer to cause electrostatic discharge damage to the devices.

3 Claims, 6 Drawing Sheets

(51) Int. Cl.
    *H01L 21/02*    (2006.01)
    *H01L 21/67*    (2006.01)
    *B28D 7/04*     (2006.01)

(56) References Cited

U.S. PATENT DOCUMENTS

| | | | | |
|---|---|---|---|---|
| 2004/0121562 | A1* | 6/2004 | Wakui | H01L 21/78 |
| | | | | 438/465 |
| 2005/0051913 | A1* | 3/2005 | Yoshida | B01F 3/04985 |
| | | | | 261/76 |
| 2005/0142815 | A1* | 6/2005 | Miyazaki | H01L 21/02238 |
| | | | | 438/464 |
| 2011/0175243 | A1* | 7/2011 | Jo | H01L 21/0212 |
| | | | | 257/798 |
| 2013/0105998 | A1* | 5/2013 | Matsumura | C08G 73/1039 |
| | | | | 257/791 |
| 2013/0203237 | A1* | 8/2013 | Yamaguchi | H01L 21/78 |
| | | | | 438/460 |
| 2014/0103527 | A1* | 4/2014 | Marimuthu | H01L 21/6835 |
| | | | | 257/737 |
| 2016/0099176 | A1* | 4/2016 | Matsuzaki | H01L 33/0095 |
| | | | | 438/464 |
| 2016/0141209 | A1* | 5/2016 | Takano | H01L 21/3046 |
| | | | | 257/620 |
| 2019/0271733 | A1* | 9/2019 | Hayashishita | C09J 7/25 |

* cited by examiner

WAFER PROCESSING METHOD

BACKGROUND OF THE INVENTION

Field of the Invention

The present invention relates to a wafer processing method for dividing a wafer into individual devices.

Description of the Related Art

When pure water is used as cutting water and cleaning water in cutting a wafer by a cutting blade of a cutting apparatus, static electricity is liable to be generated on the wafer due to the high resistivity (specific resistance value) of pure water. Normally, therefore, mixed water obtained by mixing pure water with carbon dioxide and being lower than pure water in resistivity is used. The mixed water is produced while regulating the mixing ratio by controlling flow rates of pure water and carbon dioxide by use of an appropriate mixing apparatus. By producing mixed water having such a resistivity as not to generate static electricity and supplying the mixed water to the part where the wafer and the cutting blade make contact with each other, it is possible to prevent static electricity from being generated on the wafer at the time of dividing the wafer (see, for example, Japanese Patent Laid-Open No. 1999-300184).

SUMMARY OF THE INVENTION

However, when mixed water having such a resistivity as not to generate static electricity is produced by mixing carbon dioxide with pure water by use of the above-mentioned mixing apparatus and is used as cutting water and cleaning water, there arises a problem. The concentration of carbon dioxide in the mixed water may be raised, and the acidity of the mixed water may become strong, whereby a base part (metal) of the cutting blade may be corroded or the cutting blade may be dissolved, resulting in an increase in wear.

It is therefore an object of the present invention to provide a wafer processing method by which a cutting blade can be prevented from being corroded or worn and electrostatic discharge damage to devices can be prevented from being generated.

In accordance with an aspect of the present invention, there is provided a wafer processing method for dividing a wafer formed with devices in a plurality of regions partitioned by a plurality of division lines formed in a grid pattern on a front surface of the wafer, along the division lines, the wafer processing method including: a holding step of holding the wafer on a chuck table provided in a cutting apparatus, through a dicing tape; and a dividing step of cutting the wafer held on the chuck table along the division lines by a cutting blade, wherein in the dividing step, cleaning water including pure water mixed with carbon dioxide is supplied to the front surface of the wafer, and cutting water including pure water alone or pure water mixed with carbon dioxide in a concentration lower than that of the cleaning water is supplied to the cutting blade.

Preferably, the cutting blade is covered with a blade cover, and the blade cover includes: a slit-shaped opening for protruding a tip of the cutting blade therethrough at a bottom portion of the blade cover; a cutting water jet port for supplying the cutting water to the cutting blade; and draining means for draining the cutting water.

Preferably, the cleaning water is supplied to the front surface of the wafer by a nozzle disposed in a direction intersecting a path of movement of the chuck table.

According to the wafer processing method of the present invention, the cutting water is restrained from contacting the front surface of the wafer by the cleaning water supplied to the front surface of the wafer, whereas the cleaning water is restrained from contacting the cutting blade by the cutting water supplied to the cutting blade. Thus, during cutting of the wafer, the cleaning water and the cutting water are always shielded by each other. As a result, the cleaning water can be prevented from contacting the cutting blade to cause corrosion or excessive wearing of the cutting blade, and the cutting water can be prevented from contacting the front surface of the wafer to cause electrostatic discharge damage to devices.

The cutting blade is covered with the blade cover, and the blade cover includes at least the slit-shaped opening for protruding a tip of the cutting blade therethrough at a bottom portion of the blade cover, the cutting water jet port for supplying the cutting water to the cutting blade, and the draining means for draining the cutting water. In performing the above-mentioned dividing step, therefore, the cutting water supplied toward the cutting blade is drained to the outside of the blade cover, and the cutting water can be prevented, as securely as possible, from contacting the front surface of the wafer. In addition, the cutting blade is covered by the blade cover in the manner of being sandwiched, with its tip protruding from only the opening. Therefore, the exposed part of the cutting blade is small, so that the cleaning water supplied to the wafer can be prevented, as reliably as possible, from contacting the cutting blade.

In performing the dividing step, the cleaning water is supplied to the front surface of the wafer by a nozzle disposed in a direction intersecting a path of movement of the chuck table. Therefore, cleaning water with swarf such as contaminants mixed therein can be efficiently removed from the whole surface of the wafer.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

1. Cutting Apparatus

Figure 1:
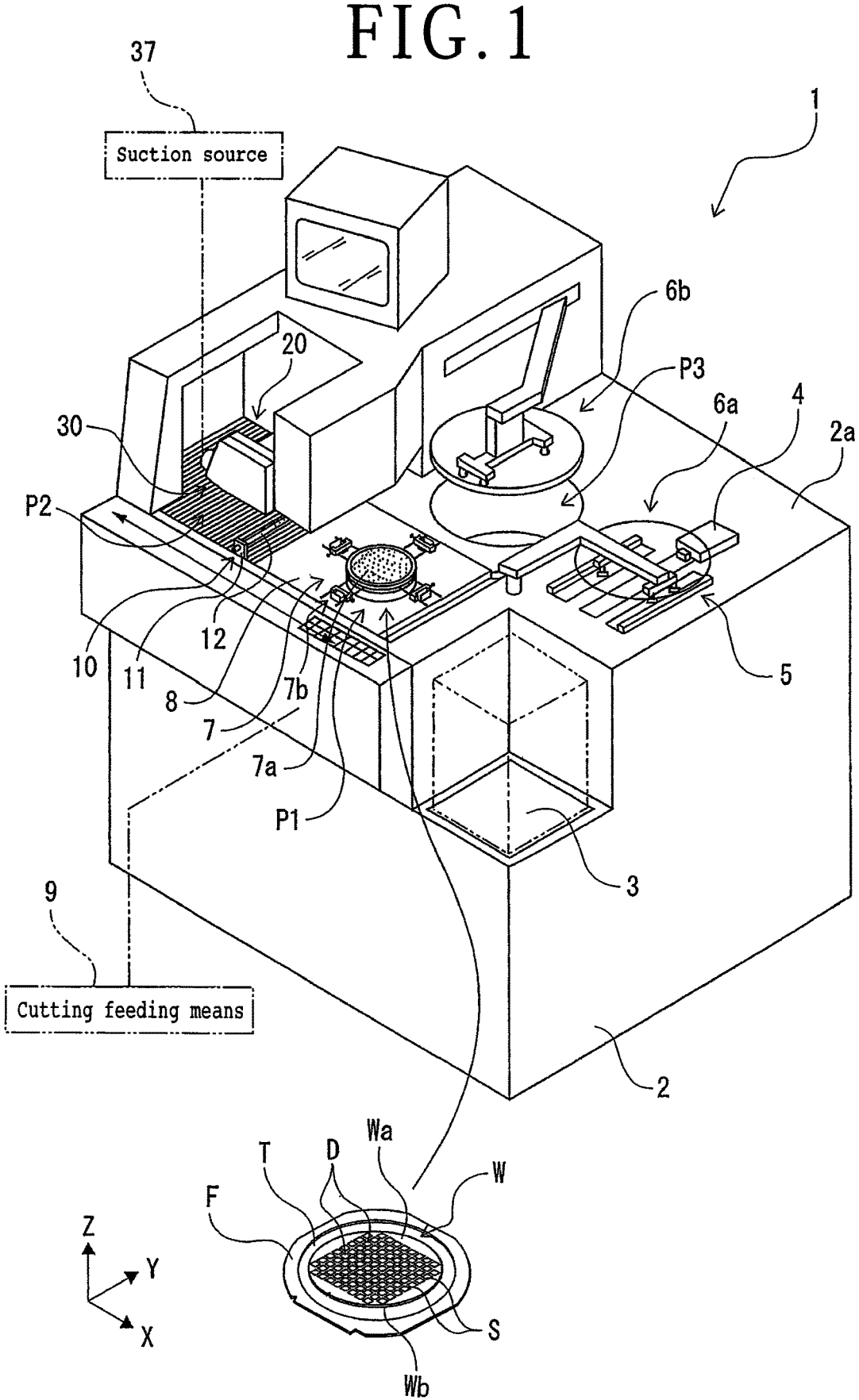
FIG. 1 is a perspective view showing an exemplary configuration of a cutting apparatus.

A cutting apparatus 1 shown in FIG. 1 is an example of a cutting apparatus for cutting a wafer W as a workpiece. The cutting apparatus 1 has an apparatus base 2, and a cassette 3 in which a plurality of wafers W as workpieces are accommodated is disposed at a front portion of the apparatus base 2. Carrying-in/out means 4 for carrying out the wafer W yet to be cut from the cassette 3 and carrying in the wafer W having been cut into the cassette 3, a temporary placing region 5 where the wafer W is to be temporarily placed, and a chuck table 7 for holding the wafer W thereon are disposed on an upper surface 2a of the apparatus base 2. First carrying means 6a for carrying the wafer W between the temporary placing region 5 and the chuck table 7 is disposed in the vicinity of the cassette 3.

An upper surface of the chuck table 7 constitutes a holding surface 7a on which the wafer W is to be held by suction. The chuck table 7 can suction hold the wafer W by the holding surface 7a which is connected to a suction source (not shown). In addition, a plurality (in the illustrated example, four) of clamp portions 7b for holding an annular frame F are disposed around the chuck table 7. The periphery of the chuck table 7 is covered by a moving base 8, and the chuck table 7 can be moved together with the moving base 8 in a cutting feed direction (X-axis direction) by being driven by cutting feeding means 9 disposed in the inside of the apparatus base 2. A region where the chuck table 7 is positioned as shown in FIG. 1 is a carrying-in/out region P1 where the wafer W is carried in or out in relation to the chuck table 7.

The cutting apparatus 1 is provided with cleaning water supplying means 10 which is disposed in a direction (Y-axis direction) intersecting the cutting feed direction (X-axis direction), or the direction of the path of movement of the chuck table 7, and which is adapted to supply cleaning water to the wafer W, and cutting means 20 for cutting the wafer W held on the holding surface 7a of the chuck table 7. A region where the cutting means 20 is disposed as shown in FIG. 1 is a cutting region P2 where cutting of the wafer W is conducted.

In the center of the apparatus base 2 is disposed second carrying means 6b by which the wafer W having been cut is carried from the chuck table 7 positioned in the carrying-in/out region P1 to a cleaning region P3 where the wafer W having been cut is cleaned.

Figure 2:
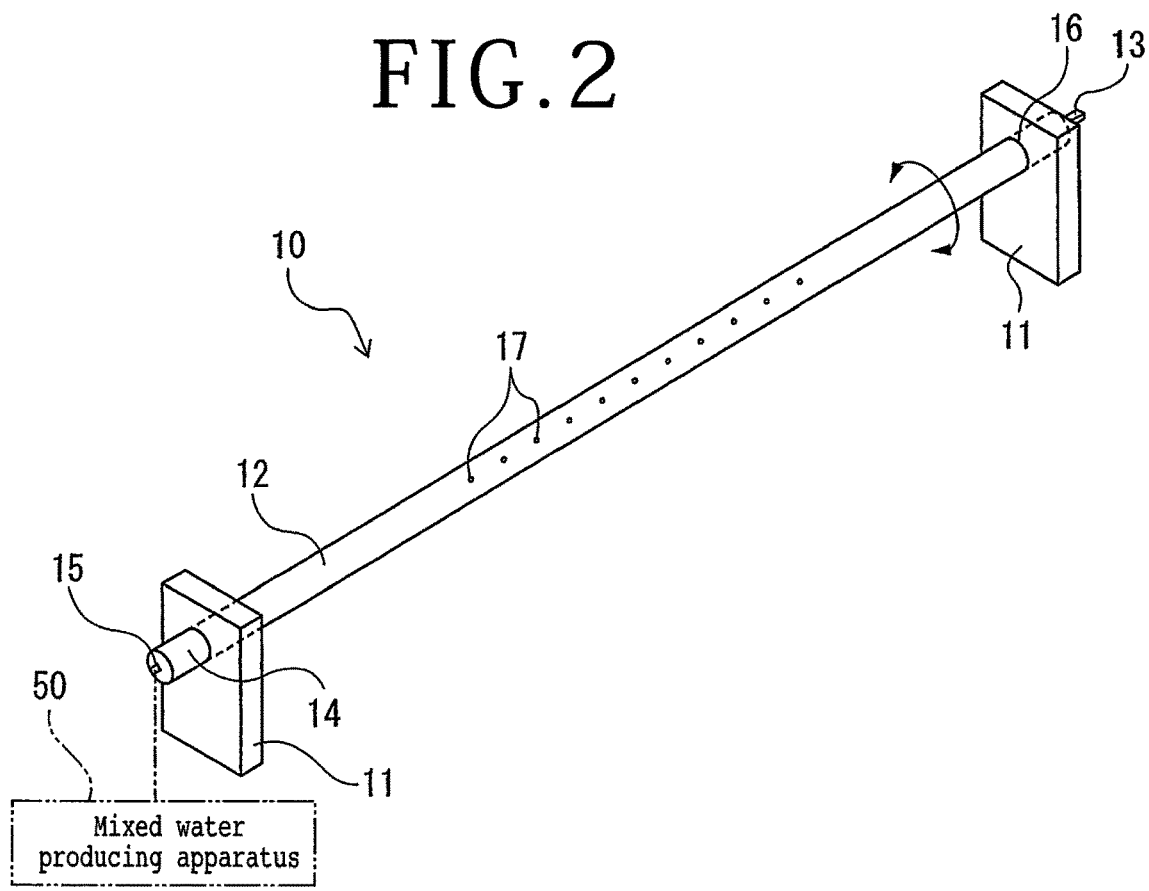
FIG. 2 is a perspective view showing the configuration of cleaning water supplying means.

The cleaning water supplying means 10 includes a pair of support pieces 11 erected from the apparatus base 2, and a nozzle 12 supported by the support pieces 11 in a rotatable manner. The nozzle 12 has its longitudinal direction set in an intersecting direction (Y-axis direction) intersecting the moving direction of the chuck table 7. As shown in FIG. 2, a knob 13 is formed at one end portion of the nozzle 12, and a fixed connection portion 14 is connected to the other end portion of the nozzle 12.

Each of the support pieces 11 is formed with a through-hole 16 penetrating it in the Y-axis direction. One end side of the nozzle 12 is rotatably inserted in the through-hole 16 in the support piece 11 on one side, whereas the fixed connection portion 14 is fixed and inserted in the through-hole 16 in the support piece 11 on the other side. The nozzle 12 is connected in a rotatable manner in relation to the fixed connection portion 14, and the nozzle 12 can be rotated about an axis in the Y-axis direction by rotating the knob 13.

The nozzle 12 is formed with a plurality of cleaning water jet ports 17 through which cleaning water obtained by mixing pure water with carbon dioxide in a mixed water producing apparatus 50, for example, is jetted toward the wafer W held by the chuck table 7. The plurality of cleaning water jet ports 17 are aligned along the longitudinal direction of the nozzle 12. The cleaning water jet ports 17 are connected to the mixed water producing apparatus 50 through a fluid supply hole 15 formed in the fixed connection portion 14. By rotating the knob 13 to rotate the nozzle 12, the cleaning water jet ports 17 can be directed into a desired direction. Note that the positions and number of the cleaning water jet ports 17 are not limited to those in the present embodiment. Therefore, it is sufficient that a plurality of cleaning water jet ports 17 are formed in a circumferential surface of the nozzle 12, according to the size (diameter) of the wafer W as an object to be cut.

Figure 3:
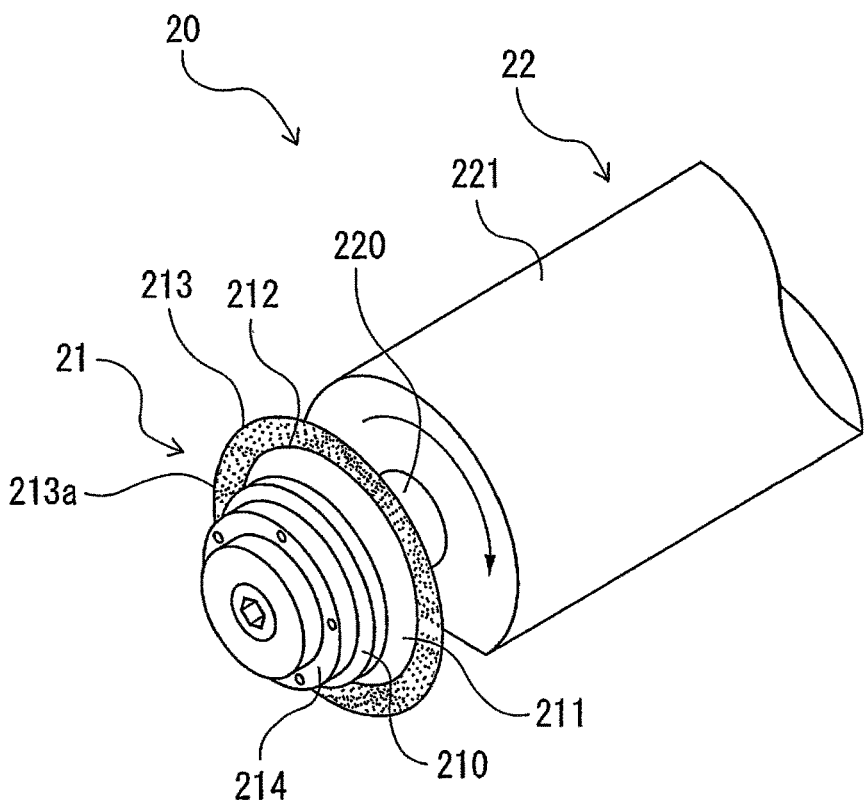
FIG. 3 is a perspective view showing the configuration of cutting means.

As illustrated in FIG. 3, the cutting means 20 is provided at least with a cutting blade 21 for cutting the wafer W, and a spindle unit 22 for supporting the cutting blade 21 in a rotatable manner. The spindle unit 22 includes at least a spindle 220 to which the cutting blade 21 is mounted and which is rotatable, and a spindle housing 221 surrounding the spindle 220 in a rotatable manner. With the spindle 220 rotated by a motor (not shown), the cutting blade 21 can be rotated at a predetermined rotating speed. The configuration of the cutting blade 21 is not particularly limited; for example, the cutting blade 21 includes an electroformed blade in which abrasive grains are bound by nickel plating.

The cutting blade 21 includes a hub base boss portion 210 having an opening in the center thereof, a hub base tapered portion 211 continuous with the hub base boss portion 210, and a cutting edge 213 mounted to an outer peripheral portion 212 of the hub base tapered portion 211. The cutting blade 21 is fixed in a state of being united with the spindle 220 by a mount fixing nut 214.

Figure 4:
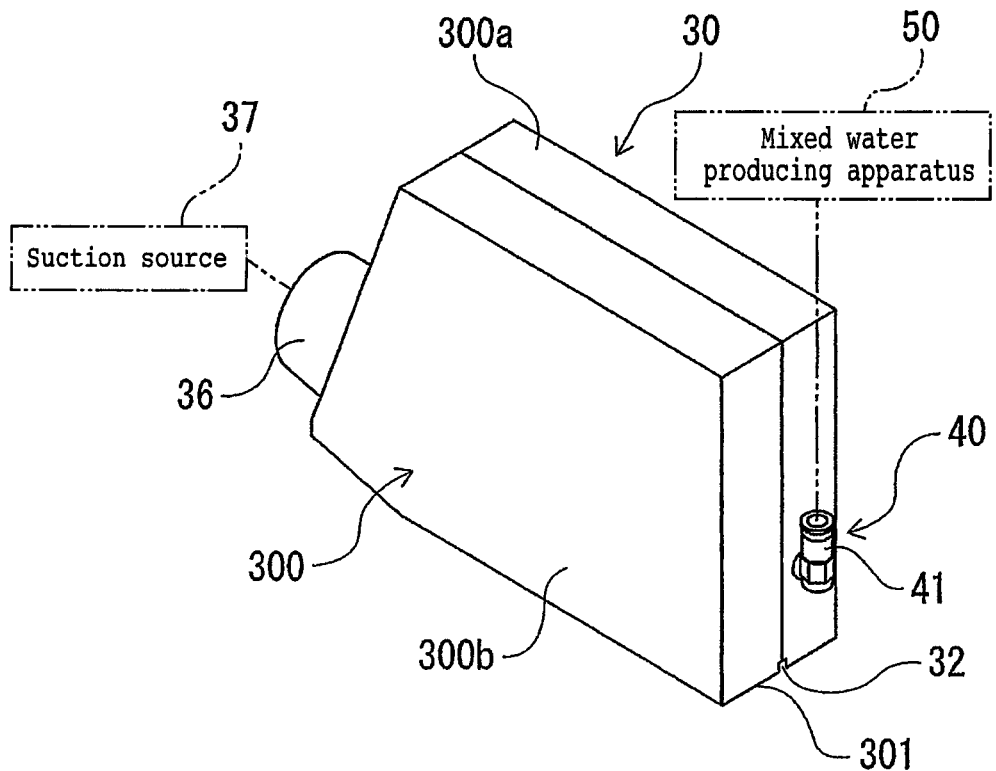
FIG. 4 is a perspective view showing the configuration of a blade cover.

The cutting blade 21 is covered in a rotatable manner by a blade cover 30 depicted in FIG. 4. The blade cover 30 has a box-shaped cover main body 300 that covers the cutting blade 21. The cover main body 300 in the example shown in FIG. 4 includes a rear side cover 300a attached to the spindle housing 221, and a front side cover 300b attached while facing the rear side cover 300a. Cutting water supplying means 40 for supplying cutting water to the cutting blade 21 is disposed on the blade cover 30, and the cutting water supplying means 40 is connected to the mixed water producing apparatus 50.

Figure 5:
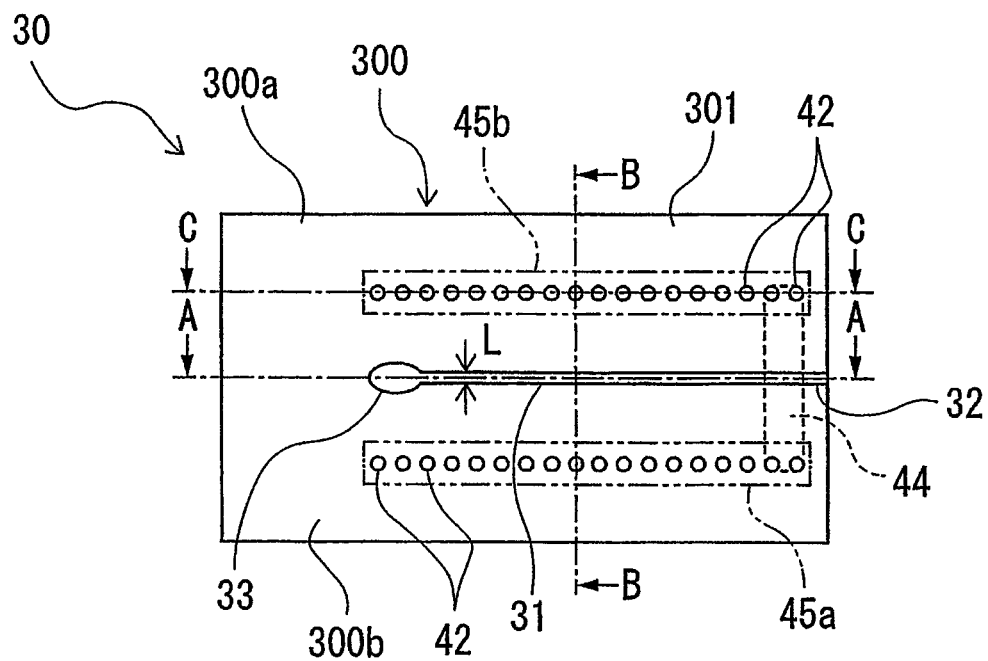
FIG. 5 is a bottom view showing the configuration of the blade cover.

A specific configuration of the blade cover 30 will be described. As illustrated in FIG. 5, a slit-shaped opening 31 which has a predetermined width L in the thickness direction of the cutting edge 213 of the cutting blade 21 shown in FIG. 3 and through which a tip of the cutting blade 21 is protruded is formed in a bottom portion 301 of the cover main body 300. When the cutting blade 21 is accommodated in the inside of the cover main body 300, an edge tip 213a of the cutting edge 213 protrudes slightly through the opening 31. The width L of the opening 31 need only be slightly greater than the tip shape of the cutting edge 213, and is, for example, not more than 1 mm.

An air intake passage 32 is formed in the bottom portion 301 of the cover main body 300, in the state of communicating with the opening 31. The air intake passage 32 extends to the side (upstream side) opposite to the rotating direction of the cutting blade 21 and toward the outside of the blade cover 30, and is formed to reach one end of the bottom portion 301 of the cover main body 300 shown in FIG. 4. In other words, the air intake passage 32 is opening at one end of the bottom portion 301.

Figure 6:
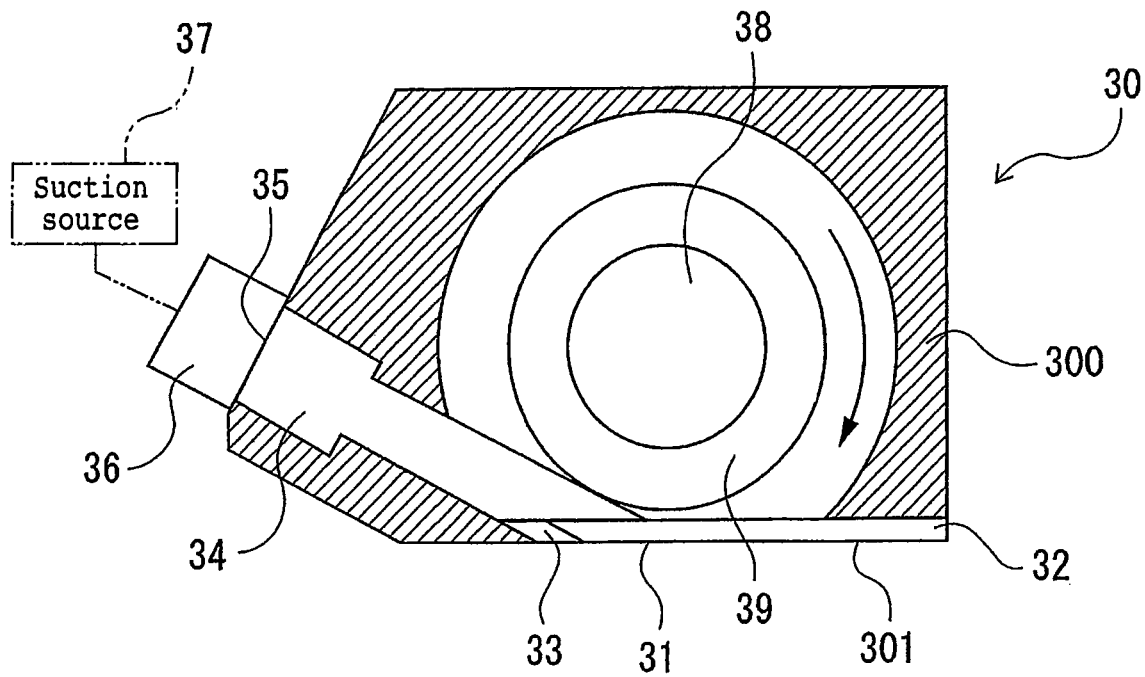
FIG. 6 is a sectional view taken along line A-A of FIG. 5, showing the configuration of the blade cover.

As illustrated in FIG. 6, a drain passage 34 communicating with the opening 31 at one end thereof and communicating with a suction source 37 through a drain port 35 at the other end thereof is formed in the inside of the cover main body 300. The drain passage 34 is formed on the leading end side in the rotating direction of the cutting blade 21 shown in FIG. 3, in a state of being inclined relative to the bottom portion 301 of the cover main body 300. Draining means 36 including a pipe is inserted into a tip of the drain passage 34 which tip is on the suction source 37 side, and an exposed portion of the draining means 36 is protruding to the outside of the cover main body 300. With the draining means 36 inserted in the drain passage 34, a lowering in suction pressure due to leakage of air through a mating surface of the rear side cover 300a and the front side cover 300b shown in FIG. 4 is prevented.

A suction opening 33 is formed at one end of the opening 31 and on an extension line of the drain passage 34. The suction opening 33 has a width greater than the width L of the opening 31 shown in FIG. 5. While the suction opening 33 in the example shown in FIG. 5 is elliptic in shape, this shape is not restrictive. With the wide suction opening 33 thus formed at one end of the opening 31, cutting water used at the time of cutting can be efficiently taken into the drain passage 34.

Figure 7:
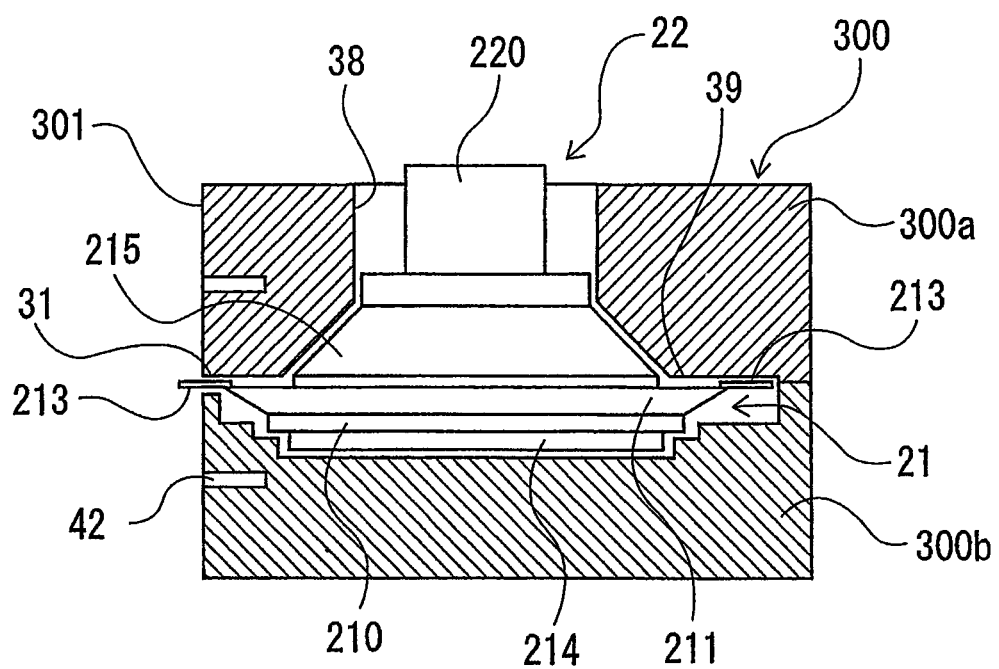
FIG. 7 is a sectional view taken along line B-B of FIG. 5, showing the configuration of the blade cover.

As illustrated in FIG. 7, a mount flange 215 is connected to a tip of the spindle 220 constituting the cutting means 20. The cutting blade 21 is mounted to the mount flange 215, and is clamped between the mount flange 215 and a mount fixing nut 214 in screw engagement with a tip of the mount flange 215. On the other hand, a spindle insertion hole 38 for insertion therethrough of the spindle 220 into the inside of the cover main body 300 is formed in the center of the cover main body 300. In addition, the cover main body 300 is formed with a mount flange accommodating portion 39 communicating with the spindle insertion hole 38. The mount flange accommodating portion 39 has such a space as to be able to accommodate the mount flange 215 connected to the tip of the spindle 220 and the cutting blade 21 fixed to the mount flange 215 by the mount fixing nut 214. Thus, the blade cover 30 has a configuration wherein the cutting blade 21 can be accommodated in the inside of the cover main body 300 in such a state that only a portion of the cutting edge 213 of the cutting blade 21 coming into contact with the wafer W is protruded through the opening 31 and the other portions of the cutting blade 21 than the protruding portion are covered.

Figure 8:
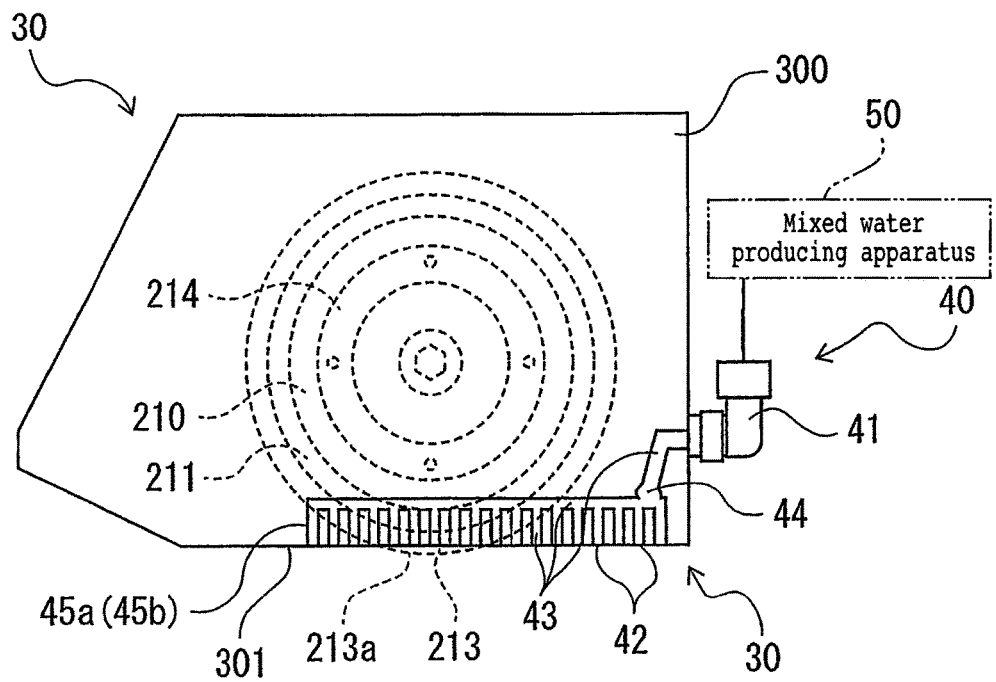
FIG. 8 is a sectional view taken along line C-C of FIG. 5, showing the configuration of the blade cover.

As illustrated in FIG. 8, the cutting water supplying means 40 includes: a supplying section 41 mounted to a side portion of the cover main body 300; a plurality of cutting water jet ports 42 formed in the bottom portion 301 of the cover main body 300; and a cutting water supply passage 43 which is connected to the cutting water jet ports 42 at one end thereof and is connected to the mixed water producing apparatus 50 through the supplying section 41 at the other end thereof.

The plurality of cutting water jet ports 42 are aligned on a straight line parallel to the extending direction of the opening 31 shown in FIG. 5, and the part where the plurality of cutting water jet ports 42 are aligned on the straight line is constituted as cutting water supplying regions 45a and 45b. At least two cutting water supplying regions 45a and 45b are formed in the bottom portion 301 of the cover main body 300, on opposite sides of the opening 31. Note that the number and shape of the cutting water jet ports 42 are not specifically restricted. Besides, more than two cutting water supplying regions 45a and 45b may be disposed.

A connection supply passage 44 which extends inside the cover main body 300 in a direction perpendicular to the paper surface and which is for supplying cutting water toward the two cutting water supplying regions 45a and 45b formed at the bottom portion 301 of the cover main body 300 shown in FIG. 5 is connected to the cutting water supply passage 43. As depicted in FIG. 4, the supplying section 41 is disposed at the rear side cover 300a, so that an outer piping from the mixed water producing apparatus 50 to the blade cover 30 is provided at a single part. This configuration ensures that, for example, at the time of detaching the front side cover 300b for replacing the cutting blade 21, the cutting blade 21 can be replaced with good workability because the front side cover 300b is not accompanied by the outer piping.

Figure 9:
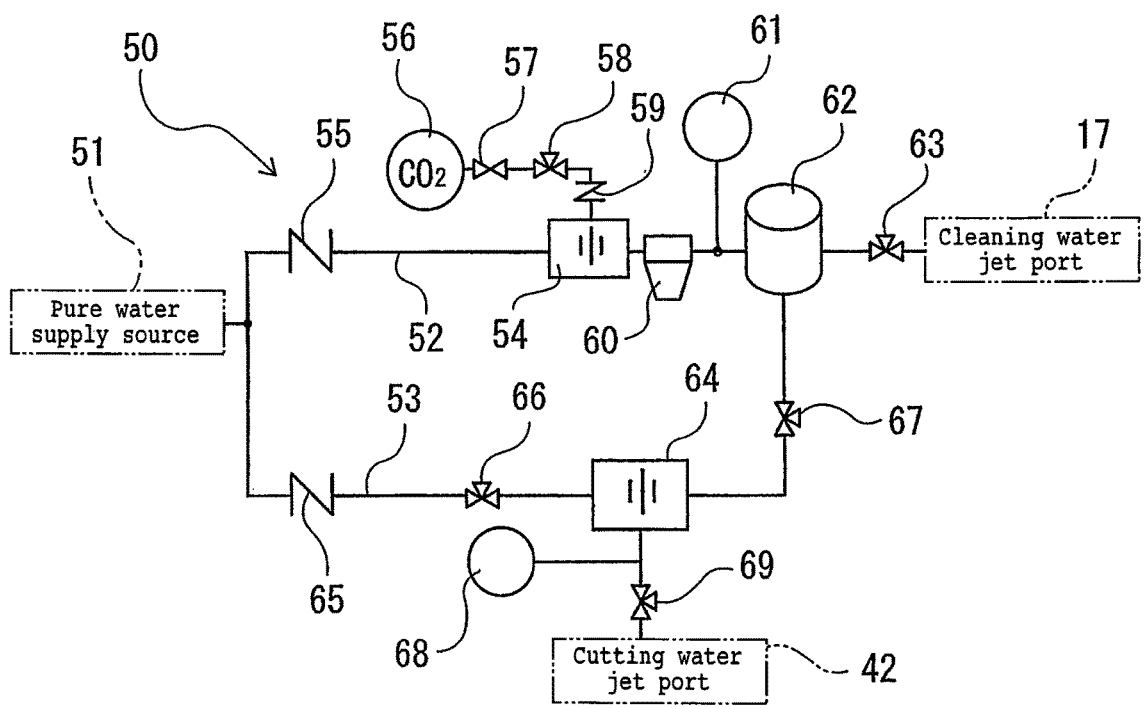
FIG. 9 is an illustration of an example of the configuration of a mixed water producing apparatus.

Now, a specific configuration of the mixed water producing apparatus 50 will be described below. As illustrated in FIG. 9, the mixed water producing apparatus 50 includes a pure water supply source 51 in which pure water is reserved, and a first supply passage 52 and a second supply passage 53 branched in two from the pure water supply source 51. First mixing means 54 for mixing pure water fed out from the pure water supply source 51 with carbon dioxide (carbonic acid gas) is disposed in the first supply passage 52, and a catch valve 55 for preventing cleaning water including pure water mixed with carbon dioxide in a desired concentration from flowing back is interposed between the pure water supply source 51 and the first mixing means 54.

Carbon dioxide to be mixed at the first mixing means 54 is reserved in a tank 56, and the tank 56 is connected to the first mixing means 54 through a stop valve 57, a gas flow regulating valve 58, and a catch valve 59. By supplying carbon dioxide to the first mixing means 54 while regulating the flow rate of carbon dioxide by the gas flow regulating valve 58, mixed water including pure water mixed with carbon dioxide in a desired concentration can be produced at the first mixing means 54.

The first mixing means 54 is connected to the cleaning water jet ports 17 through a filter 60, first concentration measuring means 61, a water reserving tank 62, and a first flow regulating valve 63. Mixed water mixed at the first mixing means 54 is deprived of contaminants and the like by the filter 60, and is then subjected to measurement of carbon dioxide concentration by the first concentration measuring means 61. When the mixed water thus measured is confirmed to have reached a desired concentration, it is reserved in the water reserving tank 62. Then, the first flow regulating valve 63 can feed out the mixed water as cleaning water to the cleaning water jet ports 17 while regulating the mixed water to a desired flow rate.

Second mixing means 64 for mixing pure water fed out from the pure water supply source 51 with mixed water reserved in the water reserving tank 62 is disposed in the second supply passage 53. A catch valve 65 for preventing backward flow of pure water and a second flow regulating valve 66 for regulating the flow rate of pure water are interposed between the pure water supply source 51 and the second mixing means 64. In addition, a third flow regulating valve 67 for regulating the flow rate of mixed water is interposed between the water reserving tank 62 and the second mixing means 64.

The second mixing means 64 is connected to the cutting water jet ports 42 through second concentration measuring means 68 and a fourth flow regulating valve 69. At the second mixing means 64, pure water fed out to the second mixing means 64 through the second supply passage 53 and mixed water fed out from the water reserving tank 62 to the second mixing means 64 are mixed with each other, whereby mixed water lower in carbon dioxide concentration than the cleaning water can be produced. The mixed water mixed at the second mixing means 64 is subjected to measurement of carbon dioxide concentration by the second concentration measuring means 68, and, when the mixed water is found to have reached a desired concentration, the fourth flow regulating valve 69 can feed out the mixed water as cutting water to the cutting water jet ports 42 while regulating the mixed water to a desired flow rate.

2. Wafer Processing Method

A wafer processing method of cutting the wafer shown in FIG. 1 by the cutting apparatus 1 to divide the wafer into individual devices D will be described below. The wafer W is an example of a circular disk-shaped workpiece, and is, for example, a silicon wafer. On a front surface Wa of the wafer W, the devices D are formed in a plurality of regions partitioned by a plurality of division lines S formed in a grid pattern. A back surface Wb on the side opposite to the front surface Wa of the wafer W is attached to a dicing tape T, for example. The wafer W is united with an annular frame F through the dicing tape T, and a plurality of the wafers W in this state are accommodated in the cassette 3.

(1) Holding Step

First, the carrying-in/out means 4 draws out the wafer W united with the frame F through the dicing tape T from the cassette 3, and places the wafer W in the temporary placing region 5. Next, the first carrying means 6a carries out the wafer W temporarily placed in the temporary placing region 5, and places the wafer W on the holding surface 7a of the chuck table 7 standing by in the carrying-in/out region P1, with the dicing tape T side on the lower side. Then, the wafer W is suction held onto the holding surface 7a where a suction force supplied from a suction source (not shown) acts, and the frame F is fixed by the clamp portions 7b.

(2) Dividing Step

Subsequently, the chuck table 7 is moved toward the cutting region P2 by the cutting feeding means 9. When the chuck table 7 has been moved to a position under the cutting means 20 to which the blade cover 30 is mounted, the spindle 220 shown in FIG. 3 is rotated to rotate the cutting blade 21 at a predetermined rotating speed, and the cutting means 20 is lowered in the Z-axis direction, whereby cutting of the front surface Wa of the wafer W by the cutting edge 213 of the cutting blade 21 is performed.

Figure 10:
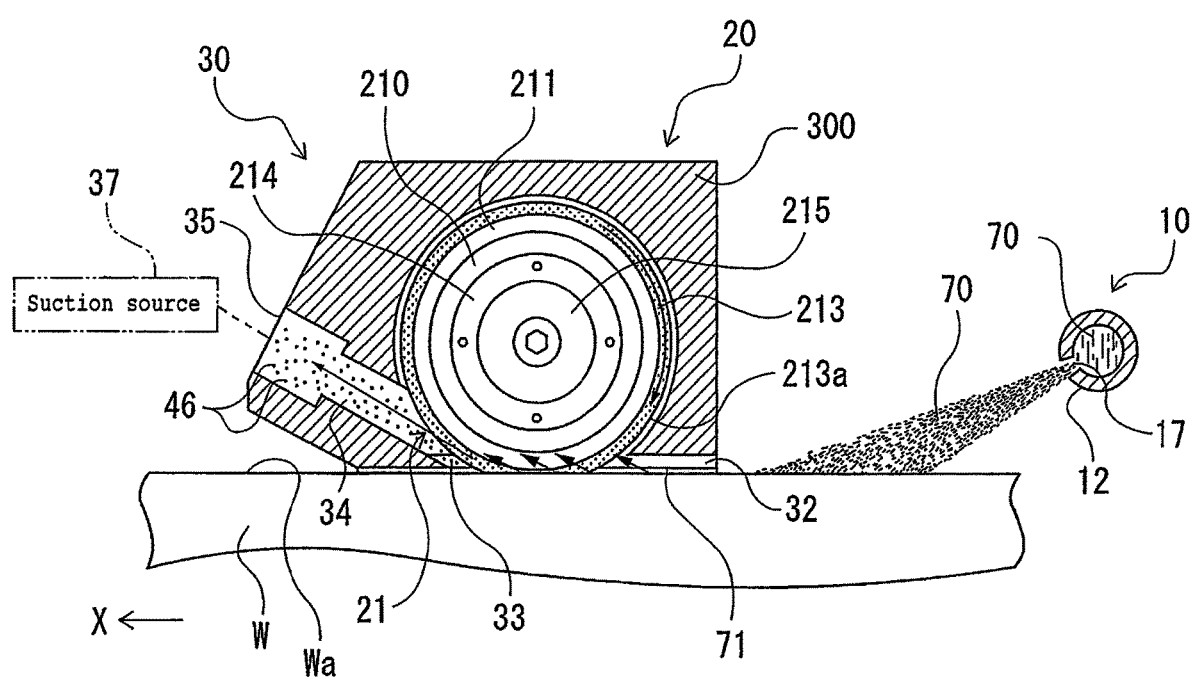
FIG. 10 is a sectional view showing a state of cutting of a wafer.

FIG. 10 shows a state in which the wafer W is being cut by the cutting blade 21. In the dividing step, desired mixed waters (cleaning water and cutting water) are preliminarily produced by the mixed water producing apparatus 50 shown in FIG. 9, cleaning water 70 including pure water mixed with carbon dioxide is supplied to the front surface Wa of the wafer W by the cleaning water supplying means 10, whereas cutting water 71 including pure water alone or pure water mixed with carbon dioxide in a concentration lower than that of the cleaning water 70 is supplied to the cutting blade 21 by the cutting water supplying means 40 shown in FIG. 8.

The flow of production of the desired mixed waters at the mixed water producing apparatus 50 will be described. In the present embodiment, it is assumed that the resistivity of pure water reserved in the pure water supply source 51 is 1 to 18 MΩ·cm. At the first mixing means 54, pure water fed out from the pure water supply source 51 to the first mixing means 54 and carbon dioxide fed out from the tank 56 to the first mixing means 54 at a desired flow rate regulated by the gas flow regulating valve 58 are mixed with each other, to produce desired mixed water. Here, as the resistivity of mixed water is lower, the conductivity of the mixed water is higher and the carbon dioxide concentration is higher. Specifically, in order to prevent static electricity from being generated on the wafer W by the cleaning water 70 including pure water mixed with carbon dioxide, it is preferable to set the resistivity of the cleaning water 70 below that of pure water. Accordingly, the resistivity of the cleaning water 70 is set at 0.1 MΩ·cm, for example. The mixed water produced by the first mixing means 54 is deprived of impurities when passing through the filter 60, after which if the carbon dioxide concentration measured by the first concentration measuring means 61 has reached a desired value, the mixed water can be reserved in the water reserving tank 62 and utilized as the cleaning water 70.

On the other hand, at the second mixing means 64, pure water fed from the pure water supply source 51 to the second mixing means 64 and mixed water fed out from the water reserving tank 62 to the second mixing means 64 are mixed with each other in a predetermined ratio, to produce mixed water lower in carbon dioxide concentration than the cleaning water 70. Here, as the resistivity of the mixed water is higher, the conductivity of the mixed water is lower and the carbon dioxide concentration is lower. Specifically, in order to restrain the acidity of cutting water including pure water mixed with carbon dioxide from increasing, it is preferable to set the resistivity of the cutting water 71 at least above that of the cleaning water. Accordingly, the resistivity of the cutting water 71 is set at 0.6 MΩ·cm, for example. The mixed water obtained by mixing by the second mixing means 64 can be utilized as the cutting water 71 when its carbon dioxide concentration measured by the second concentration measuring means 68 has reached a desired value. In addition, pure water fed out from the pure water supply source 51 may also be used as the cutting water 71.

The first concentration measuring means 61 and the second concentration measuring means 68 are not particularly limited in configuration. However, it is preferable, for example, to manage the carbon dioxide concentrations of the cleaning water 70 and the cutting water 71 used during cutting, by use of a specific resistance measuring instrument and based on desired resistivity values. It is recommendable, though, to produce mixed waters with optimal carbon dioxide concentrations by appropriately changing the resistivity of the cleaning water 70 and the cutting water 71, according to the material of the wafer W as an object to be processed and the material of the cutting blade 21 to be used.

The cutting water supplying means 40 shown in FIG. 8 does not directly supply cutting water 71 toward the cutting blade 21 in rotation. However, the cutting water 71 is supplied to the front surface Wa of the wafer W in the pair of cutting water supplying regions 45a and 45b constituted of the plurality of cutting water jet ports 42 shown in FIG. 5. In addition, the suction force supplied from the suction source 37 shown in FIG. 10 acts at the drain passage 34 and the suction opening 33, so that the cutting water 71 flows toward the opening 31 and the suction opening 33. For this reason, the cutting water 71 can be collected at a part (processing point) where the cutting blade 21 and the wafer W make contact with each other, and that part can be cooled. In addition, by the suction force supplied from the suction source 37, the cutting water 71 collecting in the suction opening 33 can be sucked into the drain passage 34, and can be drained through the drain port 35 to the outside of the blade cover 30.

When the front surface Wa of the wafer W is cut by the cutting edge 213 while moving the wafer W in the X-axis direction relative to the cutting means 20, the cutting water 71 supplied to the front surface Wa of the wafer W and collecting is moved accompanying the rotation of the cutting edge 213 rotated inside the blade cover 30 and is liable to flow in the rotating direction. Therefore, the cutting water 71 containing swarf 46 generated upon cutting is liable to be taken into the drain passage 34 through the opening 31 and the suction opening 33. In this instance, air is taken in toward the cutting edge 213 rotating inside the blade cover 30 through the air intake passage 32, so that the suction force of the suction source 37 stably acts in the drain passage 34, whereby the cutting water 71 can be securely sucked into the drain passage 34.

Further, even when the flow rate of the cutting water 71 supplied to the front surface Wa of the wafer W is increased, the cutting water 71 can be efficiently sucked at the suction opening 33. In addition, even in the case where the swarf 46 is greater than the width L of the opening 31 shown in FIG. 5, if the swarf 46 has such a size as to be able to pass the suction opening 33, clogging of the swarf 46 such as contaminants in the opening 31 can be prevented. In this way, the swarf 46 generated during cutting can be discharged through the drain port 35 to the outside of the blade cover 30 together with the cutting water 71. The cleaning water 70 is supplied to the front surface Wa of the wafer W from the nozzle 12 disposed in the direction (Y-axis direction) intersecting the path of movement of the chuck table 7 shown in FIG. 1, and, therefore, the cutting water 71 with the swarf 46 mixed therein can be efficiently removed from the whole area of the front surface Wa of the wafer W.

It is desirable to continue supplying the cleaning water 70 from the cleaning water jet ports 17 of the nozzle 12 to the front surface Wa of the wafer W and to continue supplying the cutting water 71 from the cutting water jet ports 42 to the above-mentioned processing point as shown in FIG. 10, during cutting of the wafer W. The cleaning water 70 jetted from the cleaning water jet ports 17 flows on the front surface Wa of the wafer W, whereby the cutting water 71 can be restrained from contacting the front surface Wa of the wafer W. On the other hand, the cutting water 71 jetted from the cutting water jet ports 42 flows to the processing point while covering the periphery of the cutting edge 213 protruding from the opening 31; even if the cleaning water 70 enters the inside of the blade cover 30, therefore, the cleaning water 70 can be restrained by the cutting water 71 from contacting the cutting blade 21. As a result, it is possible to prevent the cutting blade 21 from being dissolved and to maintain the cutting blade 21 in a good condition, while preventing static electricity from being generated on the front surface Wa of the wafer W.

The wafer W shown in FIG. 1 is cut along the division lines S by the cutting blade 21 in this way, whereby the wafer W is divided into individual devices D. Thereafter, the wafer W having been cut is carried by the second carrying means 6b to the cleaning region P3, to be cleaned there, then the cleaned wafer W is temporarily placed in the temporary placing region 5 by the first carrying means 6a, and is accommodated into the cassette 3 by the carrying-in/out means 4.

As has been described above, in the wafer processing method according to the present invention, in performing the dividing step, the cleaning water 70 including pure water mixed with carbon dioxide is supplied to the front surface Wa of the wafer W, whereas the cutting water 71 including pure water alone or pure water mixed with carbon dioxide in a concentration lower than that of the cleaning water 70 is supplied to the cutting blade 21. Therefore, the cutting water 71 is restrained from contacting the front surface Wa of the wafer W by the cleaning water 70 flowing on the front surface Wa, and the cleaning water 70 is restrained from contacting the cutting blade 21 by the cutting water 71; thus, during cutting of the wafer W, the cleaning water 70 and the cutting water 71 are always shielded by each other. Consequently, the cutting blade 21 can be prevented from being corroded or excessively worn due to the cleaning water 70, and the cutting water 71 can be prevented from contacting the front surface Wa of the wafer W to cause electrostatic discharge damage to the devices D.

In addition, the cutting blade 21 according to the present invention is entirely covered by the blade cover 30 having a draining function. In performing the dividing step, therefore, the cutting water 71 supplied to the part where the cutting blade 21 and the wafer W make contact with each other is drained to the outside of the blade cover 30, and the cutting water 71 can be prevented, as securely as possible, from contacting the front surface Wa of the wafer W. Besides, the cutting blade 21 is covered by the blade cover 30 in the manner of being sandwiched, with its tip protruding only from the opening 31. For this reason, the exposed portion of the cutting blade 21 is small, so that the cleaning water 70 supplied to the wafer W can be prevented, as assuredly as possible, from contacting the cutting blade 21.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing a wafer formed with devices in a plurality of regions partitioned by a plurality of division lines formed in a grid pattern on a front surface of the wafer, along the division lines, the wafer processing method comprising:
    a holding step of holding the wafer on a chuck table provided in a cutting apparatus, through a dicing tape; and
    a dividing step of cutting the wafer held on the chuck table along the division lines by a cutting blade,
    wherein in the dividing step, cleaning water including pure water mixed with carbon dioxide is supplied to the front surface of the wafer, and cutting water including pure water alone or pure water mixed with carbon dioxide in a concentration lower than that of the cleaning water is supplied to the cutting blade.

2. The wafer processing method according to claim 1, wherein the cutting blade is covered with a blade cover, and
    the blade cover includes
    a slit-shaped opening for protruding a tip of the cutting blade therethrough at a bottom portion of the blade cover,
    a cutting water jet port for supplying the cutting water to the cutting blade, and
    draining means for draining the cutting water.

3. The wafer processing method according to claim 1, wherein the cleaning water is supplied to the front surface of the wafer by a nozzle disposed in a direction intersecting a path of movement of the chuck table.

* * * * *